United States Patent
Finn et al.

(10) Patent No.: US 8,666,530 B2
(45) Date of Patent: Mar. 4, 2014

(54) SILICON ETCHING CONTROL METHOD AND SYSTEM

(75) Inventors: Daragh Seosamh Finn, Portland, OR (US); Andrew Edwin Hooper, Portland, OR (US); A. Grey Lerner, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 405 days.

(21) Appl. No.: 12/970,483

(22) Filed: Dec. 16, 2010

(65) Prior Publication Data
US 2012/0158169 A1    Jun. 21, 2012

(51) Int. Cl.
*G06F 19/00*    (2011.01)

(52) U.S. Cl.
USPC ............... 700/109; 700/103; 700/104

(58) Field of Classification Search
USPC .......................... 700/109, 103, 104
See application file for complete search history.

(56) References Cited

U.S. PATENT DOCUMENTS

| | | | |
|---|---|---|---|
| 6,245,581 B1 | 6/2001 | Bonser et al. | |
| 6,623,333 B1 | 9/2003 | Patel et al. | |
| 6,625,497 B2 | 9/2003 | Fairbairn et al. | |
| 6,790,376 B1 | 9/2004 | Markle et al. | |
| 6,802,045 B1 * | 10/2004 | Sonderman et al. | 716/106 |
| 6,895,295 B1 | 5/2005 | Grover et al. | |
| 6,939,198 B1 | 9/2005 | Swedek et al. | |
| 7,175,505 B1 | 2/2007 | Ko et al. | |
| 7,761,179 B2 | 7/2010 | Patel et al. | |
| 2003/0124848 A1 | 7/2003 | Chinn et al. | |
| 2004/0185582 A1 | 9/2004 | Kueny | |
| 2005/0082651 A1 * | 4/2005 | Farnworth et al. | 257/678 |
| 2006/0157445 A1 | 7/2006 | Mochiki | |
| 2007/0045228 A1 | 3/2007 | Kubota et al. | |
| 2008/0286697 A1 * | 11/2008 | Verhaverbeke et al. | 430/322 |
| 2009/0108257 A1 * | 4/2009 | Cong et al. | 257/48 |
| 2009/0191690 A1 | 7/2009 | Boyle et al. | |
| 2010/0062684 A1 * | 3/2010 | Swedek et al. | 451/5 |
| 2010/0234975 A1 * | 9/2010 | Wu et al. | 700/105 |

OTHER PUBLICATIONS

Sopori et al., "A Rapid, Non-Contact Method for Measurement of Si Wafer Thickness: Principles and Preliminary Results," National Renewable Energy Laboratory, NREL/CP-520-34654, Aug. 2003.
Hamamatsu, "Optical MicroGauge C8125-10,-11," 2009.
XACTIX[R] "Xetch X3™ Specifications," http://www.xactix.com/Xetch_X3specs.htm, Oct. 20, 2010.

(Continued)

*Primary Examiner* — Kavita Padmanabhan
*Assistant Examiner* — Jason Lin
(74) *Attorney, Agent, or Firm* — Stoel Rives LLP (57) ABSTRACT

An etching control system controls exposure of a silicon workpiece to a spontaneous etchant. The system determines an amount of material to be removed from the silicon workpiece, based on metrology information corresponding to the silicon workpiece. An estimated etch time duration is determined for removing the amount of the material upon exposing the silicon workpiece to the spontaneous etchant for the estimated etch time duration. In some embodiments, the system monitors a change in mass of the silicon workpiece caused by exposure of the silicon workpiece to the spontaneous etchant to determine when the amount of the material has been removed from the silicon workpiece. Exposure of the silicon workpiece to the spontaneous etchant is stopped when the change in the mass of the silicon workpiece indicates that the amount of the material has been removed.

19 Claims, 6 Drawing Sheets

(56) References Cited

OTHER PUBLICATIONS

Written Opinion and International Search Report, PCT/US02011/064846, Aug. 22, 2012.

Chapman Instruments, "Wafer Thickness: MPT1000 Non-Contact Thickness Measurement System," Nov. 8, 2006.
MTI Instruments, Proforma™ Series, "Water Measurement Systems for Semiconducting and Semi-insulating Wafers," Aug. 2, 2010.

* cited by examiner

SILICON ETCHING CONTROL METHOD AND SYSTEM

TECHNICAL FIELD

This disclosure relates to etching a silicon workpiece and more particularly, but not exclusively, to a control system to control exposure of a silicon workpiece to a spontaneous etchant.

BACKGROUND INFORMATION

In one example of semiconductor fabrication, multiple devices are formed on a silicon workpiece, such as a silicon wafer. These multiple devices are then separated from one another along horizontal and vertical dice lanes to form separate dies. The devices can be separated using various dicing techniques such as laser dicing, saw dicing, laser scribing, mechanical scribing, dice-before-grind, and etching. Some dicing techniques produce defects in sidewalls of the dies and introduce along the edges and corners of the dies stress that degrades the strength of the dies. If the dies are not sufficiently strong, they may break during handling or otherwise become defective.

U.S. Patent Application Publication No. 2009/0191690 describes a dicing system and method in which dies are formed by cutting completely through or partly through a semiconductor wafer using a laser beam or dicing saw. Sidewalls of the dies are exposed to a spontaneous etchant, such as $XeF_2$, during or after dicing to smooth the sidewalls and strengthen them. The system and method described in U.S. Patent Application Publication No. 2009/0191690 is an open-loop etching system and method in which the etching parameters are set up with the assumption that a wafer to be processed has a given thickness.

SUMMARY OF THE DISCLOSURE

According to one embodiment, exposure of a silicon workpiece to a spontaneous etchant is controlled by a etching control system. The system determines an amount of material to be removed from the silicon workpiece, based on metrology information corresponding to the silicon workpiece. The system calculates the mass of the amount of the material to be removed from the silicon workpiece. The silicon workpiece is exposed to the spontaneous etchant to remove the material from the silicon workpiece. In some embodiments, the system monitors a change in mass of the silicon workpiece caused by exposing it to the spontaneous etchant to determine when the amount of the material has been removed from the silicon workpiece. Exposure of the silicon workpiece to the spontaneous etchant is stopped when the change in the mass of the silicon workpiece indicates that the amount of the material has been removed from the silicon workpiece.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
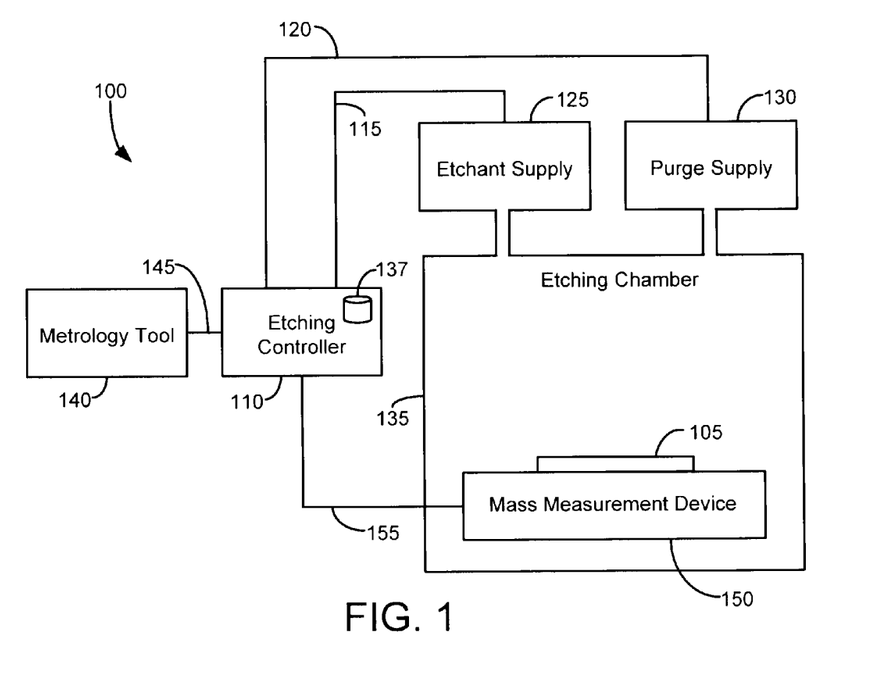
FIG. 1 is a block diagram of a closed-loop silicon etching control system according to one embodiment.

FIG. 1 is a block diagram of a closed-loop silicon etching control system 100, according to one embodiment, for removing material from a silicon workpiece 105, such as a silicon wafer. System 100 can be used for various semiconductor processing applications such as, but not limited to, silicon dicing and formation of micro electro-mechanical machines (MEMS). System 100 includes an etching controller 110 that controls, via control lines 115, 120, the flow of fluids (e.g., gasses, liquids) from an etchant supply 125 and a purge supply 130 to an etching chamber 135 in which workpiece 105 is positioned. Etching controller 110 may include one or more of a hardware circuit and a software component (e.g., a software routine, function, object). Etching controller 110 includes memory 137 that stores various forms of information that enables etching controller 110 to appropriately control the supply of etchant and purge fluids to obtain a desired etch for workpiece 105. Preferably, etchant supply 125 contains a spontaneous etchant gas that spontaneously reacts with silicon without the need of an external energy source. In one example, the spontaneous etchant gas is $XeF_2$. Although etchant supply 125 has been described as containing $XeF_2$ gas, any suitable gas or liquid that etches silicon may be contained in etchant supply 125. Other examples of suitable etchants include halides or hydrogen compounds such as $F_2$, $Cl_2$, HCl, and HBr. Purge supply 130 contains a gas that is inert to silicon. In one example, the inert gas is nitrogen gas.

Etching controller 110 controls various etching process parameters that make up an etching recipe for workpiece 105. These etching process parameters include the pressure of etching chamber 135, flow rates of the etchant and the purge fluid, number of cycles that the etchant and the purge fluid are supplied to etching chamber 135, time duration of each cycle of the etchant and the purge fluid, temperature of chamber 135, temperature of workpiece 105, and initial pressure of chamber 135 prior to etching. Preferably, the etchant and the purge fluid are alternately and cyclically (e.g., etch cycle, purge cycle, etch cycle, purge cycle, ...) supplied to etching chamber 135 during an etching process. Alternatively, the etchant may be continuously supplied to etching chamber 135 during the etching process. In some cases, cyclically supplying the etchant to etching chamber 135 increases efficiency so that more of the etchant reacts with workpiece 105 and, thus, less of the etchant is wasted. However, compared to supplying the etchant in cycles, continuously supplying the etchant to etching chamber 135 may decrease the etching time duration to remove a desired amount of material from workpiece 105, but tends to waste more etchant.

System 100 also includes a metrology tool 140 that communicates metrology information 145 to etching controller 110. Alternatively, metrology information 145 can be generated by metrology tool 140 and communicated to an operator (e.g., via a display), who in response supplies metrology information 145 to etching controller 110 through an input device (e.g., keyboard). Metrology tool 140 may be integrated with other components of system 100 in a stand-alone etch processing station, or metrology tool 140 may reside on a processing station separate from the other components of system 100. In one example, metrology tool 140 is positioned inside or near etching chamber 135 to measure workpiece 105 when workpiece 105 is inside etching chamber 135. In another example, metrology tool 140 is positioned to measure workpiece 105 before workpiece 105 is positioned in etching chamber 135. In another example, metrology tool 140 resides at a station (e.g., a laser processing station) that processes workpiece 105 prior to etching.

Figure 2:
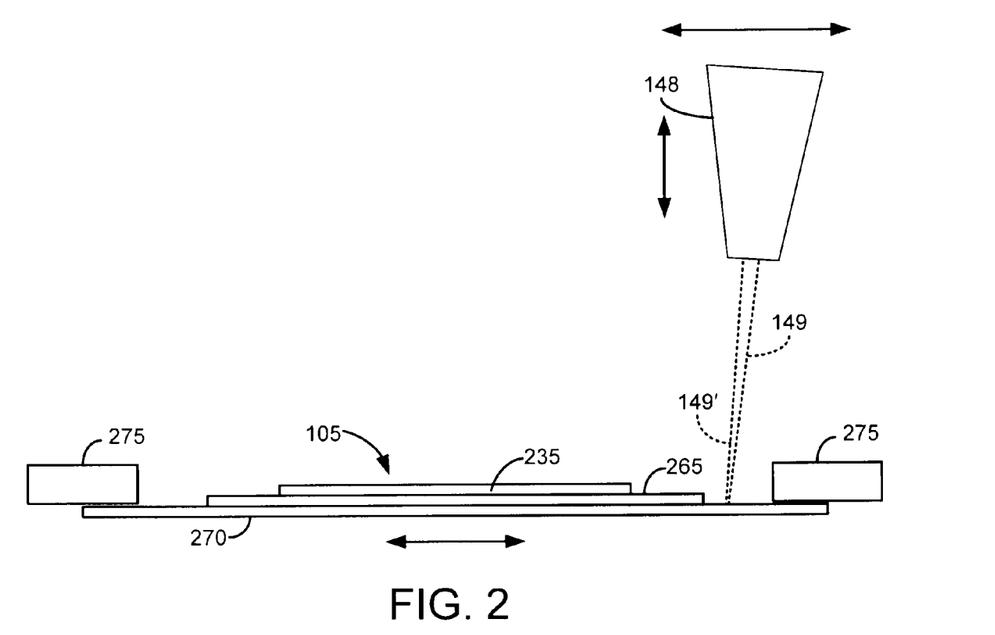
FIG. 2 is a side elevation view of a thickness measurement device of the control system of FIG. 1 according to one embodiment.
Figure 3:
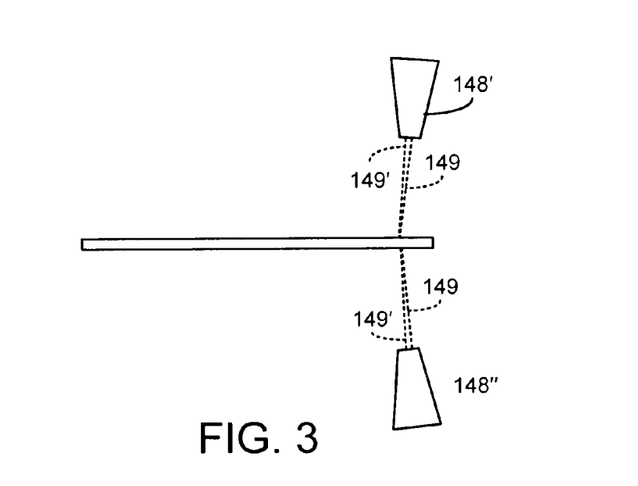
FIG. 3 is a side elevation view of the thickness measurement device according to another embodiment.

Metrology tool 140 measures one or more characteristics of workpiece 105 to generate metrology information 145. For example, metrology tool 140 measures one or more dimensions of workpiece 105. In one example, metrology tool 140 includes a thickness measurement device 148 for measuring the thickness of one or more portions of workpiece 105 as shown in FIG. 2. Thickness measurement device 148 may be a contact or non-contact type thickness measurement device. Suitable examples of thickness measurement device 148 include an optical-type non-contact thickness measurement device, an impedance type non-contact thickness measurement device, a contact-type dial gauge measurement device, and a linear transducer. Other conventional thickness measurement technologies may be used. Thickness measurement device 148 pictured in FIG. 2 is an optical-type non-contact thickness measurement device (e.g., a laser scanner) that transmits a light beam 149 (e.g., a laser beam) and receives a reflected beam 149' that enables thickness measurement device 148 to determine the thickness of an object, such as workpiece 105. For example, thickness measurement device 148 uses interference of light measurements or reflectance measurements to determine the thickness of workpiece 105. Thickness measurement device 148 moves relative to workpiece 105 (by moving one or both of thickness measurement device 148 and workpiece 105) to one or more target locations of workpiece 105 to measure its thickness. As pictured in FIG. 3, thickness measurement device 148 may include positioned on opposing major surfaces of workpiece 105 at least two components 148', 148" that each transmit light beams 149 and receive reflected beams 149' to measure the thickness of workpiece 105.

Etching controller 110 may communicate with metrology tool 140 to command it to capture one or more measurements at specific instances. Etching controller 110 uses metrology information 145 to determine an amount of material to remove from workpiece 105. For example, metrology information 145 enables etching controller 110 to determine (e.g., calculate) the surface area, the volume, and the mass of the material that is to be removed from workpiece 105. The rate at which an etchant, such as $XeF_2$, removes material from workpiece 105 is a function of the surface area of the material to be removed. Thus, metrology information 145 enables etching controller 110 to estimate the duration of time in which workpiece 105 is to be exposed to the etchant to remove a certain volume of material. Etching controller 110 uses metrology information 145 to appropriately control the supply of the etchant and the purge fluid to remove a desired amount of material from workpiece 105. Accordingly, metrology information 145 is used in a feed-forward manner for etching workpiece 105.

System 100 also includes a mass measurement device 150 positioned inside etching chamber 135. Workpiece 105 rests on mass measurement device 150 so that the mass of workpiece 105 can be measured during the etching process. Preferably, mass measurement device 150 is a high precision measurement device that can detect relatively small changes in the mass of workpiece 105 as it is being etched. For example, the total mass of workpiece 105 and supporting members (die attach film, backing tape, tape frame), if any, may be 200 grams (g) or more (e.g., about 200-1,000 g), while the mass of the amount of material to remove by etching may be significantly less (e.g., about 5 milligrams (mg) to about 1 g, typically about 10-50 mg). Accordingly, mass measurement device 150 is capable of measuring the total mass of workpiece 105 and supporting members and sensing the relatively small change in mass due to etching. In one example, mass measurement device 150 has a precision of about 1 mg or better (e.g., precision of about 1-0.01 mg). In another example, mass measurement device 150 has a precision of about 0.1 mg. Preferably, the precision of mass measurement device 150 correlates to an etch depth resolution of 1 micron, or less (1-0.1 micron).

Various types of devices may be used for mass measurement device 150. Examples of mass measurement device 150 may include, but are not limited to, a thin-beam load cell connected to a digital panel meter (e.g., a model LCL-454G thin-beam load cell connected to a model DP41-B digital meter, both available from Omega Engineering Limited of Manchester, United Kingdom); an SM series analytical balance available from Scientech, Inc. of Boulder, Colo.; an SA series analytical balance available from Scientech, Inc.; an automatic or manual mass comparator (e.g., a model CCE 1005 manual mass comparator available from Sartorius AG of Goettingen, Germany); a model ME614S analytical balance from Sartorius; and a model AX504 analytical balance available from Mettler-Toledo, Inc. of Columbus, Ohio.

Mass measurement device 150 measures the mass of workpiece 105 and communicates mass metrology information 155 to etching controller 110. Mass metrology information 155 represents mass measurements captured by mass measurement device 150. Etching controller 110 uses mass metrology information 155 to monitor the change in mass of workpiece 105 during the etching process. In other words, mass measurement device 150 acts as a closed-loop metrology component that enables etching controller 110 to determine when an appropriate amount of material has been removed from workpiece 105.

Figure 4A:
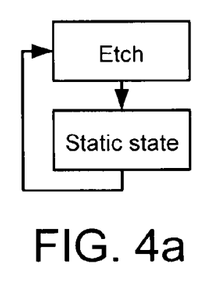
FIGS. 4a, 4b, and 4c are process flow diagrams of etching processes including static states according to different embodiments.
Figure 4B:
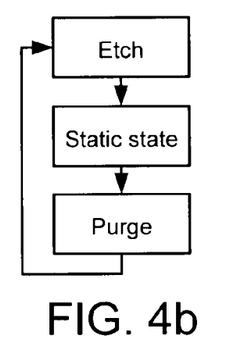
Figure 4C:
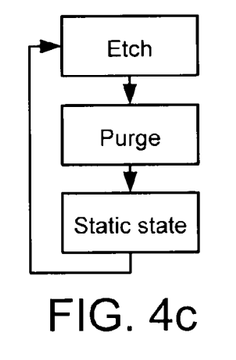

Preferably, mass measurement device 150 measures the mass of workpiece 105 during static states of the etching process. For example, during a static state, the supply of the etchant to etching chamber 135 and other dynamic mechanical operations of system 100 which may induce vibrations that could degrade the precision and accuracy of mass measurement device 150 are temporarily suspended so that mass measurement device 150 can obtain accurate mass measurements of workpiece 105. In one example, etchant is cyclically supplied to etching chamber 135 and system 100 enters a static state between etching cycles. FIGS. 4a, 4b, and 4c are process flow diagrams showing three different process examples that may be implemented to provide a static state for measuring the mass of workpiece 105. In the process of FIG. 4a, supply of the etchant is temporarily suspended to provide the static state. In the process of FIG. 4b, the static state follows an etch cycle before a purge cycle begins. In the process of FIG. 4c, the static state follows the purge cycle and is before the next etch cycle. In the processes of FIGS. 4b and 4c, the static state need not be implemented during each iteration of the etch and purge cycles.

In one embodiment, etching controller 110 uses metrology information 145 to estimate the duration of time necessary to remove a desired amount of material from workpiece 105 and determines when to read mass measurements during the etching process. In one example, etching controller 110 reads the mass measurement from mass measurement device 150 periodically throughout the etching process. In another example, etching controller 110 reads the mass measurement from mass measurement device 150 at the beginning of the etching process and near the end of the etching process. In another example, etching controller 110 reads the mass measurement from mass measurement device 150 at the beginning of the etching process, near the middle of the etching process, and near the end of the etching process. In another example, etching controller 110 dynamically controls when to read mass measurements based on previous mass measurements so that more measurements are captured when the mass of workpiece 105 approaches a desired final mass. Etching controller 110 compares (e.g., subtracts) the mass measurements obtained during the etching process to determine the mass of the material that has been removed from workpiece 105.

Etching Silicon Dies

Figure 5:
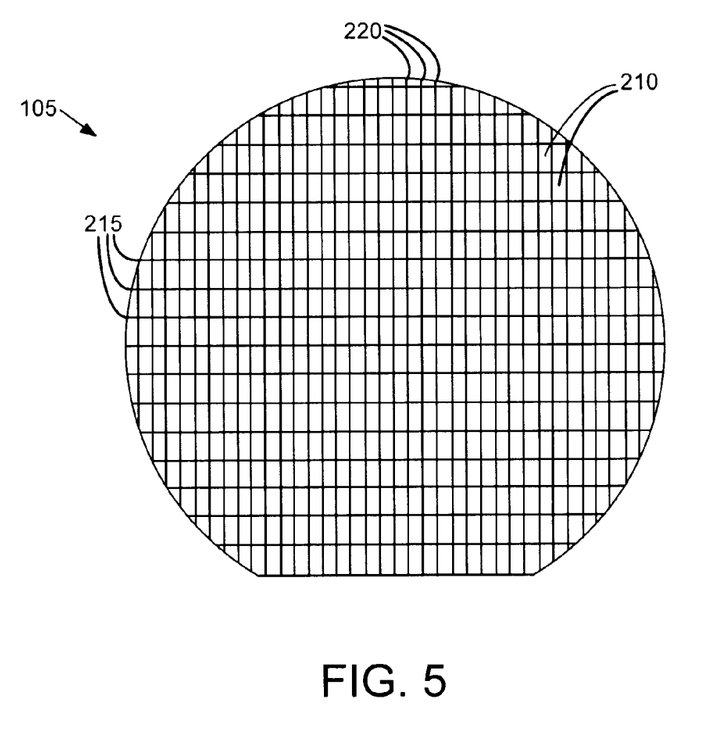
FIG. 5 is a top plan view of a diced silicon workpiece for processing by the system of FIG. 1.

In one embodiment, system 100 is configured for implementation in a silicon die fabrication process. In this embodiment, workpiece 105 includes multiple devices and is cut to form multiple dies 210 as shown in FIG. 5, for example. Dies 210 are separated via horizontal dice lanes 215 and vertical dice lanes 220. Various dicing methods may be implemented for separating dies 210 from one another. In one example, a laser beam is moved relative to workpiece 105 to focus sites arranged along dice lanes 215, 220 and cuts completely through workpiece 105 at the focus sites. In another example, a saw blade is moved relative to workpiece 105 along dice lanes 215, 220 and cuts completely through workpiece 105. In another example, a laser beam or saw blade is used to cut partly through workpiece 105 along dice lanes 215, 220 so that bridging portions remain that provide a floor for dice lanes 215, 220. The bridging portions can be removed by the etching process or by grinding a backside of workpiece 105 (e.g., a dice-before-grind process) before or after the etching process. One or more surfaces of workpiece 105 may be cleaned using conventional techniques to remove debris formed during dicing.

Figure 6A:
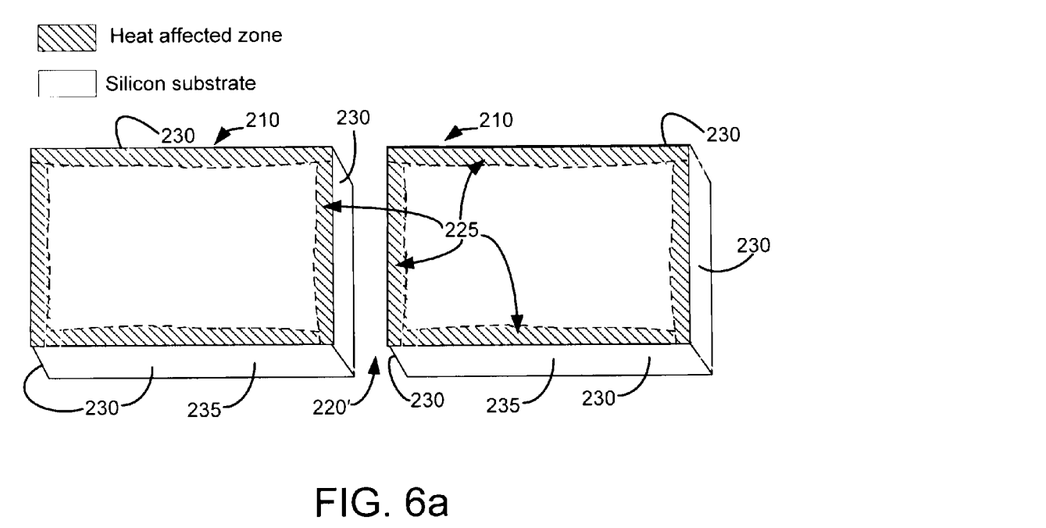
FIGS. 6a and 6b are respective top isometric and side cross-sectional views showing heat-affected zones of silicon dies of the workpiece of FIG. 5.
Figure 6B:
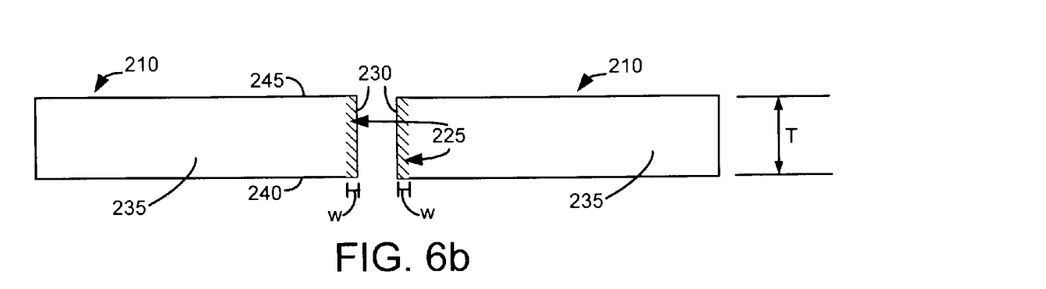

FIGS. 6a and 6b show respectively top isometric and cross-sectional views of two dies 210 separated from each other by dice lane 220'. Using a laser beam or saw blade to cut along dice lane 220' produces heat-affected zones (HAZs) 225 along sidewalls 230 of dies 210. HAZs 225 correspond to portions of a silicon substrate 235 of workpiece 105 that have been altered by cutting with the laser beam or saw blade. For example, HAZs 225 correspond to portions of substrate 235 that have been transformed to amorphous silicon or polysilicon. HAZs 225 degrade the structural integrity of dies 210. For example, HAZs 225 include defects that negatively affect the strength of dies 210. HAZs 225 also introduce increased levels of stress near the edges and corners of sidewalls 230 of dies 210. Accordingly, it is desirable to remove HAZs 225 to relieve some of the stress of dies 210. In this embodiment, system 100 is configured to etch sidewalls 230 of dies 210 to remove HAZs 225 and thereby strengthen dies 210.

The width (w) of HAZs 225 is dependent on various factors associated with the type of process used to cut substrate 235. For example, the width of HAZs 225 when a laser beam is used for dicing is dependent on laser energy, pulse width, and laser wavelength as well as the properties (e.g., the thermal diffusion coefficient) of the material being cut. A single laser pulse measurement may be performed to estimate the width of HAZs 225. Moreover, the properties of substrate 235 may be analyzed after workpiece 105 is cut to estimate the width of HAZs 225. Although the cross-sectional view of FIG. 6b shows that the width of HAZs 225 is uniform from a bottom major surface 240 of dies 210 to a top major surface 245 of dies 210, the width of HAZs 225 is typically non-uniform from bottom major surface 240 to top major surface 245. For example, if substrate 235 is cut from top major surface 245 of dies 210, the width of HAZs 225 will typically be greater near top major surface 245 compared to that of bottom major surface 240. However, spontaneous etchant preferentially etches substrate 235. For example, if etchant is introduced to sidewalls 230 from top major surface 245, more material is removed near top major surface 245 compared to that of bottom major surface 240. Accordingly, etching may be conducted to compensate for the non-uniformity in the width of HAZs 225. Preferably, information corresponding to the width and profile shapes of HAZs 225 are stored in memory 137 of etching controller 110.

Workpiece 105 may correspond to a thin wafer in which the thickness (T) of substrate 235 ranges from about 10-200 microns. Alternatively, workpiece 105 may correspond to a regular wafer in which the thickness of substrate 235 ranges from about 200-800 microns. Although the thickness of substrate 235 may be specified for a batch of workpieces, the actual thickness of substrate 235 may vary from the specified thickness. Because the etch rate of a spontaneous etchant of system 100 is dependent on the surface area to be etched (e.g., the surface area of sidewalls 230), workpiece 105 may be over etched or under etched if the actual thickness of substrate 235 varies from an expected thickness.

Figure 7:
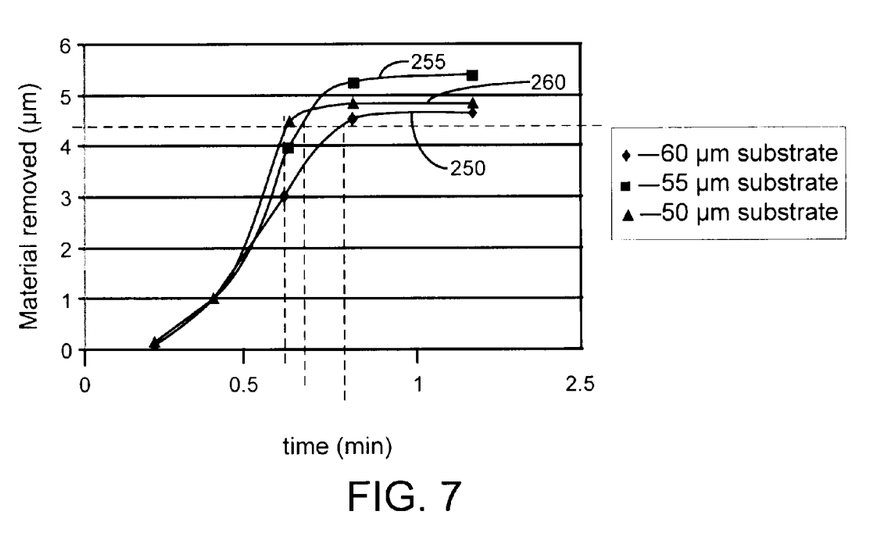
FIG. 7 is a graph showing three plots corresponding to amounts of material removed from sidewalls of dies versus etchant exposure times for different thicknesses of silicon workpieces.

For example, FIG. 7 is a graph of the widths of material removed from sidewalls 230 of dies 210 of three silicon substrates of different thicknesses versus time. Plot line 250 corresponds to a first substrate having a thickness of 60 microns; plot line 255 corresponds to a second substrate having a thickness of 55 microns; and plot line 260 corresponds to a third substrate having a thickness of 50 microns. FIG. 7 shows that if the three substrates were assumed to have a thickness of 55 microns and the etching time duration of an etching system was set to etch about 4.3 microns from sidewalls 230 of the substrates, the first substrate would be under etched in which some of the HAZs 225 would not be etched away, and the third substrate would be over etched, which would result in wasted etchant and unnecessary processing time.

Accordingly, system 100 includes metrology tool 140 to provide a measurement of the actual thickness of substrate 235 prior to etching to thereby avoid over etching and under etching. As shown in FIG. 2, metrology tool 140 includes thickness measurement device 148 that is configured to measure the thickness of substrate 235. FIG. 2 shows substrate 235 of workpiece 105 attached to a die attach film (DAF) 265 or adhesive layer, which is supported by backing tape 270. Backing tape 270 is supported by a tape frame 275 encompassing the perimeter of backing tape 270. In one example, beam 149 is focused at a location on DAF 265 and return beam 149' is sensed, and then beam 149 is focused at a location on substrate 235 and return beam 149' is sensed. The measurement taken at substrate 235 is compared to the measurement taken at DAF 265 to determine the thickness of substrate 235. Thickness measurement device 148 may take measurements at more than one location on substrate 235 and average the measurements to determine the thickness of substrate 235. Preferably, measurements are taken at locations on substrate 235 that do not correspond to a device formed on substrate 235. For example, measurements are taken near the outer edge of substrate 235 where no devices are present. Alternatively, the thickness of layers corresponding to devices formed on substrate 235 may be known or estimated, and thickness measurement device 148 can take measurements at locations corresponding to the devices. The thickness of the layers of the devices can then be subtracted from the thickness measured by thickness measurement device 148 to determine the thickness of substrate 235.

Metrology information 145 generated by thickness measurement device 148 is communicated to etching controller 110, which uses metrology information 145 to determine the total surface area of substrate 235 that is to be exposed to and etched by the etchant. Typically, the major surface of substrate 235 on which the devices are formed (e.g., the top major surface shown in FIG. 5) is not etched by the etchant because the layers of the devices, or a protective layer formed over the devices, does not spontaneously react with the etchant. In other words, etching by the etchant is typically confined to sidewalls 230 formed along dice lanes 215, 220. The total surface area of substrate 235 that will be exposed to the etchant can be determined by the following equation:

$$\text{Total Surface Area} = L \times 2 \times T$$

where L is the total length of all dice lanes 215, 220 and T is the thickness of substrate 235 measured by thickness measurement device 148. Thus, the thickness measurement enables etching controller 110 to determine the total surface area that will be exposed to the etchant. The calculated length of each dice lane 215, 220 may take into account the kerf widths of the dice lanes that are transverse to and intersect the dice lane. For example, if 20 dice lanes 215 intersect one of the dice lanes 220, the length of that dice lane 220 is calculated to be its total length minus the kerf widths of the 20 intersecting dice lanes 215. In one example, the total length L of all dice lanes 215, 220 is known and a look-up table that correlates a thickness measurement to the total surface area to be etched is provided in memory 137. If dice lanes 215, 220 include bridging portions that will be exposed to the etchant, the surface area of bridging portions is also determined and added to the total surface area. The total surface area may also account for the outer edge area of workpiece 105 if the outer edge area will be exposed to the etchant.

Etching controller 110 uses the total surface area to determine the volume of material to remove from substrate 235. For example, etching controller 110 multiples the total surface area by the width of HAZs 225 to determine the volume of the material to remove. If the etch rate is known for the total surface area calculation, the etch time duration (i.e., the time duration in which substrate 235 is to be exposed to the etchant to remove the volume of material) can be estimated. The etch rates for different surface areas may be determined experimentally and stored in memory 137. In one example, memory 137 includes a look-up table that correlates the total surface area to the volume of material to remove and the etch time duration. Although the etch time duration can be estimated, it need not be. Moreover, as mass measurement device 150 communicates mass metrology information 155 to etching controller 110 during the etching process, etching controller 110 may use mass metrology information 155 to verify the accuracy of the estimated time duration and update the estimated time duration if mass metrology information 155 indicates that the initial estimated time duration is inaccurate.

Etching controller 110 uses the volume of the material to remove from substrate 235, together with the density of substrate 235, to calculate the change in mass that is to be effected through the etching process. The density of substrate 235 can be determined based on the material properties of substrate 235. For example, if substrate 235 includes mostly silicon, its density is estimated to be about 2.33 g/cm$^3$. The mass of the material to remove from substrate 235 can be determined by multiplying the density of substrate 235 by the volume of the material to be removed.

Figure 8:
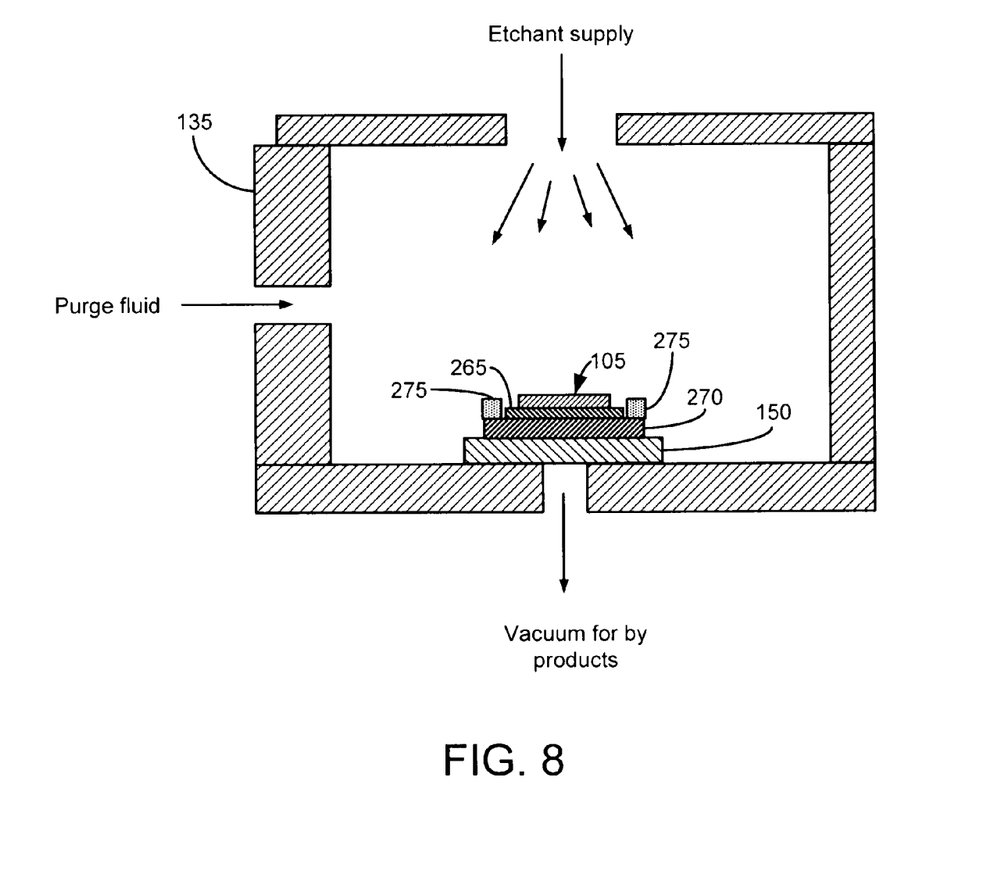
FIG. 8 is a side cross-sectional view of an etching chamber of the system of FIG. 1.

FIG. 8 is a cross-sectional view of etching chamber 135 and mass measurement device 150 according to one example. The pressure inside etching chamber 135 is controlled by etching controller 110. In one example, etching chamber 135 is evacuated to create a vacuum. The pressure inside etching chamber 135 affects the etch rate, and the pressure may be varied by etching controller 110 during the etching process to speed up or slow down the etch rate. Workpiece 105, DAF 265, backing tape 270, and tape frame 275 are positioned on mass measurement device 150, which measures the mass of workpiece 105, DAF 265, backing tape 270, and tape frame 275. Etching chamber 135 may be initially purged by introducing purge fluid into etching chamber 135. Etchant, such as XeF$_2$, is supplied to etching chamber 135 to remove HAZs 225 from sidewalls 230 of dies 210. By-products (e.g., by-product gasses) generated from the reaction of the etchant with sidewalls 230 of dies 210 are vented away. The etchant and purge fluid may be cyclically supplied to etching chamber 135 as described above, or the etchant may be continuously supplied to etching chamber 135 followed by purging after etching is complete.

Mass measurement device 150 measures the mass of workpiece 105, DAF 265, backing tape 270, and tape frame 275 at various points throughout the etching process and delivers mass metrology information 155 to etching controller 110. Etching controller 110 monitors the change in mass to determine when HAZs 225 have been removed by etching. When etching controller 110 determines that HAZs 225 have been removed, etching controller 110 stops the supply of the etchant to etching chamber 135. Accordingly, mass measurement device 150 and etching controller 110 provide real-time metrology monitoring of the etch process to avoid over etching and under etching.

Alternative Applications

In an alternative embodiment for etching dies 210, metrology tool 140 is used in conjunction with a post etching strength test of dies 210 to determine an accurate etch time duration for a given thickness of substrate 235. In this embodiment, workpiece 105 is a test workpiece that is etched to determine the etch time duration for subsequent workpieces to achieve dies 210 of a particular strength. The thickness of substrate 235 is measured by metrology tool 140, and then the sidewalls 230 of dies 210 are etched for a set time duration. The strength of one or more dies 210 is then tested to determine whether etching for the etch time duration resulted a desired strength for dies 210. In one example, a three-point flexural bend strength test is conducted to determine the breakage point of dies 210. In one example, the desired strength of dies 210 corresponds to a breakage point of 500-1000 mega Pascals (MPa), which indicates that all or significant portions of HAZs 225 have been removed. Preferably, multiple tests silicon workpieces are measured by metrology tool 140 and etched for different times. The strengths of the test silicon workpieces are then measured to provide multiple data samples that indicate the particular thickness, etch time duration, and strength of a particular test workpiece. These data samples are used to generate a model correlating various thicknesses of substrate 235 to particular etch time durations to achieve dies 210 of a desired strength. In one example, the data samples are used to generate a look-up table correlating thicknesses to etch time durations. If the etch rate of substrate 235 is known, this alternative embodiment may also be used to estimate the width of HAZs 225, assuming that etching for the etch time duration removes substantially all of HAZs 225 and does not result in appreciable over etching. In this alternative embodiment, system 100 may, but need not, include mass measurement device 150.

Although system 100 is described above in the context of etching dies 210, system 100 can be used in other semiconductor processing applications. For example, system 100 can be used in the formation of MEMS in which metrology tool 140 is configured to measure parts or all of workpiece 105 to enable etching controller 110 to determine the volume and mass of material to etch away from workpiece 105 to form one or more features of a MEM. In one example, metrology tool 140 measures workpiece 105 in one dimension to enable etching controller 110 to determine the volume and mass of material to remove. In another example, metrology tool 140 measures workpiece 105 in multiple dimensions to enable etching controller 110 to determine the volume and mass of material to remove. Mass measurement device 150 measures the mass of workpiece 105 during the etching process to enable etching controller 110 to determine when the desired amount of material has been removed to form the feature of the MEM.

System 100 can also be used to provide estimations of etchant reaction efficiency (i.e., the amount of etchant that reacts with workpiece 105 compared to the total amount of etchant introduced into etching chamber 135) for different flow rates of the etchant or variations of other parameters (e.g., pressure of etch chamber 135) of an etch recipe. For example, multiple silicon workpieces are etched using different flow rates of the etchant, and mass measurements captured by mass measurement device 150 are monitored by etching controller 110 to estimate the change in the material removal rate for each flow rate of the etchant. The material removal rate provides an indication of how much reacted and non-reacted etchant is in etching chamber 135. The change in the material removal rates for different flows of the etchant can be compared to identify the most efficient flow of the etchant.

In one example, the theoretical and ideal 100% efficient etching process using the etchant can be calculated based on stoichiometry for a given amount of the etchant (i.e., flow in standard cubic centimeters per second (sccms)). The output of this calculation gives the mass of silicon removed at 100% efficiency, when compared with the actual silicon mass removed calculated by volume or measured by mass. The ratio of mass removed at 100% efficiency to actual mass removed represents the efficiency of system 100. The closer this ratio is to 1:1, the higher the efficiency of system 100. Etching controller 110 is aware of the etchant mass or volume during etching and the change of mass of workpiece 105. During the etching process, the 100% efficient silicon mass removal calculation can be compared to the actual mass removed to continuously monitor the ratio and efficiency. System 100 may be programmed to achieve a fixed efficiency (i.e., 60%, 70%, 80%, 90%), or the efficiency could be logged/recorded to monitor system conditions.

It will be obvious to skilled persons that many changes may be made to the details of the above-described embodiments without departing from the underlying principles of the invention. The scope of the present invention should, therefore, be determined only by the following claims.

The invention claimed is:

1. A method of removing heat-affected zones from a silicon workpiece by exposing the silicon workpiece to a spontaneous etchant for an etch time duration, the silicon workpiece including a substrate having multiple dies separated by dice lanes forming sidewalls having heat-affected zones, the method comprising:
 receiving metrology information corresponding to the substrate;
 determining, based on the metrology information, a surface area of the heat-affected zones;
 determining, based on the surface area and dimensions of the heat-affected zones, a volume of material to be removed from the silicon workpiece;
 estimating, based on the volume of the material and an etch rate, an etch time duration that is sufficient to remove the volume of the material upon exposure of the silicon workpiece to the spontaneous etchant for the estimated etch time duration;
 exposing the sidewalls of the silicon workpiece to the spontaneous etchant for the estimated etch time duration to remove the heat-affected zones from the silicon workpiece; and
 stopping exposure of the silicon workpiece to the spontaneous etchant upon expiration of the estimated etch time duration.

2. The method of claim 1, in which the exposing includes cyclically exposing the silicon workpiece to the spontaneous etchant.

3. The method of claim 2, further comprising exposing the silicon workpiece to a purge gas between cycles of the exposing the silicon workpiece to the spontaneous etchant.

4. The method of claim 2, further comprising providing a static state between at least two cycles of the exposing the silicon workpiece to the spontaneous etchant to enable accurate measurement of the mass of the silicon workpiece.

5. The method of claim 1, further comprising:
 monitoring a change in mass of the silicon workpiece caused by exposure of the silicon workpiece to the spontaneous etchant; and
 updating the estimated etch time duration based on the monitoring of the change in mass of the silicon workpiece.

6. The method of claim 1, further comprising:
 processing multiple test silicon workpieces according to multiple etching recipes;
 analyzing mass metrology information generated during the processing of the multiple test silicon workpieces to determine processing efficiency of the multiple etching recipes.

7. The method of claim 1, further comprising receiving information corresponding to a width of the heat-affected zones, and in which the determining of the volume of the material to be removed from the silicon workpiece comprises calculating the volume of the material to be removed based on the width of the heat-affected zones.

8. The method of claim 1, in which the determining of the volume of the material to be removed from the silicon workpiece comprises receiving the volume from a look-up table correlating the surface area to the volume.

9. The method of claim 1, further comprising receiving information corresponding to length of the dice lanes and a thickness of the substrate, and in which the determining of the surface area of the heat-affected zones comprises calculating the surface area based on the length of the dice lanes and the thickness.

10. The method of claim 9, further comprising calculating the length of the dice lanes by subtracting from the length widths of intersecting dice lane kerfs.

11. The method of claim 1, further comprising receiving information corresponding to a thickness of the substrate, and in which the determining of the surface area of the heat-affected zones comprises receiving the surface area from a look-up table correlating the thickness to the surface area.

12. The method of claim 1, in which the dice lanes include bridging portions and the determining of the surface area includes determining surface area of bridging portions.

13. The method of claim 1, in which the surface area includes an outer edge area of the silicon workpiece.

14. A silicon etching control system, comprising:
an etching chamber in which a silicon workpiece is positioned for exposing the silicon workpiece to a spontaneous etchant to remove heat-affected zones from the silicon workpiece, the silicon workpiece including a silicon substrate and multiple dies, the multiple dies having sidewalls with the heat-affected zones generated during dicing of the silicon workpiece;
a thickness measurement device operable to measure an actual thickness of the silicon substrate and generate metrology information corresponding to the actual thickness; and
an etching controller operable to:
control supply of the spontaneous etchant to the etching chamber during an etching process;
receive, prior to the etching process, the metrology information;
determine, based on the metrology information, a surface area of the heat-affected zones;
determine, based on the surface area and dimensions of the heat-affected zones, a volume of material to be removed from the silicon workpiece;
estimate an amount of time to expose the silicon workpiece to the spontaneous etchant to remove the volume of the material; and
etch the sidewalls of the dies for the estimated amount of time to remove the heat-affected zones.

15. The system of claim 14, in which the silicon etching control system is configured to form a micro electro-mechanical machine in the silicon workpiece, and in which the metrology information represents a volume calculation of the amount of the material to be removed to form the micro electro-mechanical machine.

16. The system of claim 14, further comprising a mass measurement device operatively associated with the etching controller and positioned in the etching chamber to measure a mass of the silicon workpiece during the etching process, the mass measurement device operable to produce and deliver to the etching controller mass metrology information representing mass measurements of the silicon workpiece usable by the etching controller to determine when a change in the mass of the silicon workpiece indicates that the amount of the material has been removed from the silicon workpiece and to stop the supply of the spontaneous etchant when the amount of the material has been removed from the silicon workpiece.

17. The system of claim 16, in which the etching controller is configured to update the estimated amount of time based on the mass metrology information.

18. The system of claim 16, in which the mass measurement device is characterized by a precision of about 1 mg or better.

19. The system of claim 16, in which the etching controller is configured to provide during the etching process multiple static states in which supply of the spontaneous etchant to the etching chamber is temporarily suspended to enable accurate measurement of the mass of the silicon workpiece, the mass measurement device operable to measure the mass of the silicon workpiece and the etching controller configured to receive the mass metrology information during the static states.

* * * * *